(12) United States Patent
Hayashi et al.

(10) Patent No.: US 6,653,550 B2
(45) Date of Patent: Nov. 25, 2003

(54) INTEGRATED THIN-FILM PHOTOELECTRIC CONVERSION MODULE

(75) Inventors: Katsuhiko Hayashi, Kusatsu (JP); Tomomi Meguro, Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 10/146,408

(22) Filed: May 14, 2002

(65) Prior Publication Data

US 2003/0000565 A1 Jan. 2, 2003

(30) Foreign Application Priority Data

May 17, 2001 (JP) ........................................ 2001-147299
Mar. 18, 2002 (JP) ........................................ 2002-074004

(51) Int. Cl.[7] ........................ H01L 31/042; H01L 31/05
(52) U.S. Cl. ........................ 136/244; 136/249; 136/258; 136/261; 136/290; 257/431; 257/443; 438/80; 438/74; 438/96; 438/88
(58) Field of Search ................ 136/244, 249, 136/258, 261, 290; 257/431, 443; 438/80, 74, 96, 88

(56) References Cited

U.S. PATENT DOCUMENTS 4,806,496 A * 2/1989 Suzuki et al. ................. 438/12
5,616,185 A * 4/1997 Kukulka ..................... 136/244
6,013,870 A * 1/2000 Psyk et al. .................. 136/249
6,271,053 B1 * 8/2001 Kondo ........................ 438/57
6,274,804 B1 * 8/2001 Psyk et al. .................. 136/249
6,365,825 B1 * 4/2002 Hayashi et al. ............. 136/290

FOREIGN PATENT DOCUMENTS

| JP | 10-004202 | | 1/1998 |
| JP | 2000-68535 A | * | 3/2000 |
| JP | 2001-068713 | | 3/2001 |
| JP | 2001-119058 | | 4/2001 |

OTHER PUBLICATIONS

Dr. Wiesner, "PV Module Safety Qualification Testing (WG2 Working Draft)", International Standard IEC 1730, Feb. 1998, 11.13.111.13.4.

* cited by examiner

Primary Examiner—Alan Diamond
(74) Attorney, Agent, or Firm—Hogan & Hartson, LLP

(57) ABSTRACT

An integrated thin-film photoelectric conversion module includes a multi-layered film including a first electrode layer, a semiconductor layer and a second electrode layer stacked on a main surface of a substrate. The multi-layered film includes a cell region including a plurality of photoelectric conversion cells connected in series, a bypass diode region and a connection region. The connection region does not connect the bypass diode to the cell during reverse bias treatment of the cell and the bypass diode, while the connection region connects the bypass diode in antiparallel to at least one of the plurality of cells connected in series after the reverse bias treatment.

18 Claims, 8 Drawing Sheets

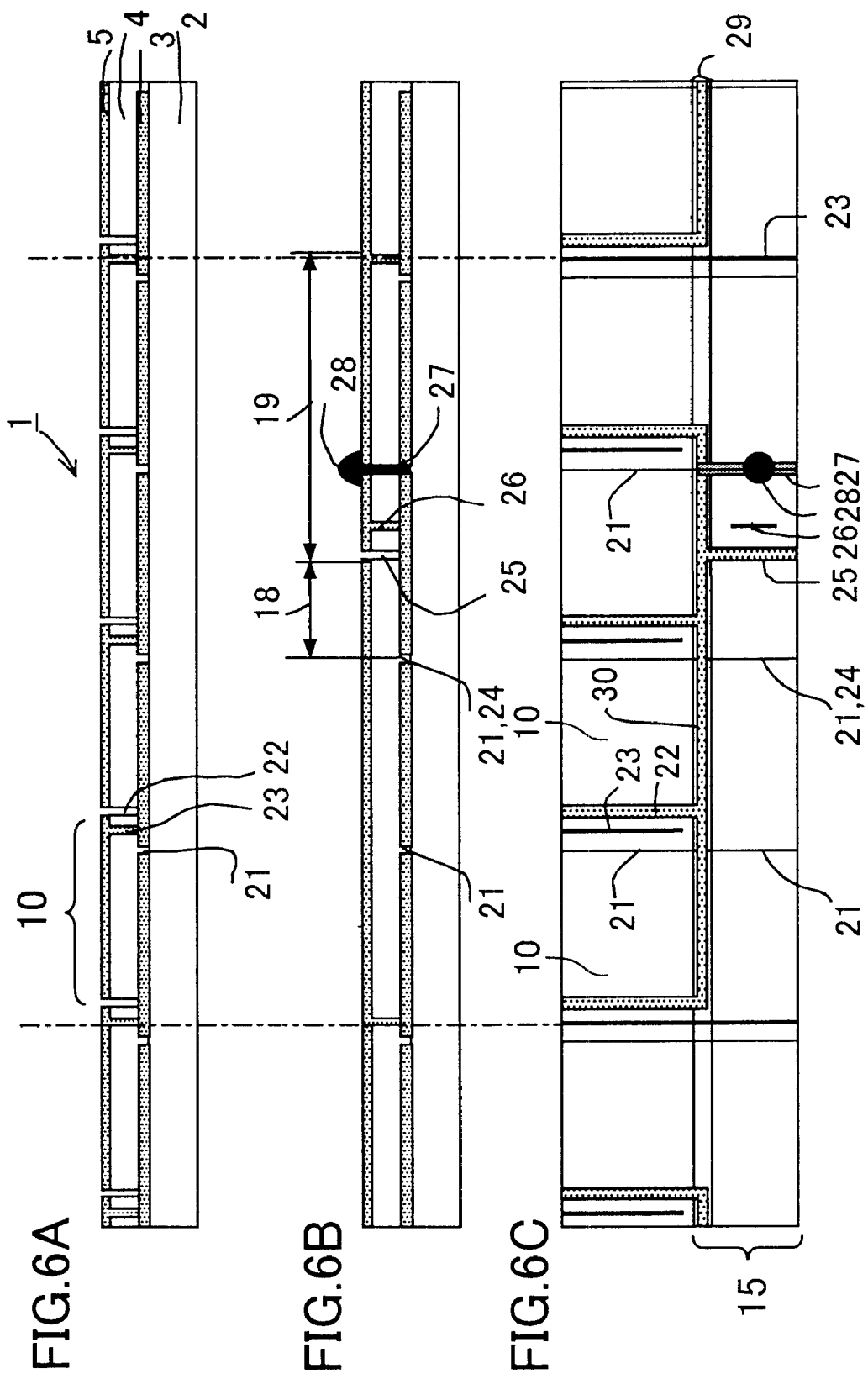

INTEGRATED THIN-FILM PHOTOELECTRIC CONVERSION MODULE

BACKGROUND OF THE INVENTION

1. Field of the Invention

The present invention relates generally to integrated thin-film photoelectric conversion modules and particularly to those with bypass diodes.

2. Description of the Background Art

Generally when a plurality of thin-film photoelectric conversion cells are connected in series to form an integrated thin-film photoelectric conversion module, a plurality of elongated rectangular cells are integrated in a direction of a minor axis thereof (see for example FIG. 4A and an associated description provided hereinafter). If dead leaves, bird-droppings and the like stick and cause shadows on a light receiving surface of a cell in such a module, the cell's photoelectromotive force decreases and then the module's overall output significantly decreases, because the cell with the reduced photoelectromotive force behaves as a diode connected in series in an opposite direction to a generated electric current and it thus exhibits an extremely large resistance.

To alleviate such a disadvantage, a plurality of cells connected in series are divided in parallel to form a plurality of series arrays which are in turn connected in parallel, as disclosed for example in Japanese Patent Laying-Open No. 2001-68713. Then, even if a cell in a series array has a photoelectromotive force reduced to zero, it would not impair electric current in the other series arrays connected in parallel to that series array and thus overall output of the module can be prevented from being significantly reduced.

If the cell behaving as the diode receives a reverse voltage more than its breakdown voltage, however, a local dielectric breakdown occurs at a portion having a lower withstand voltage. Electric current does not flow uniformly in the cell having suffered the local breakdown and thus causes local heat generation referred to as "hot spot phenomenon."

If the module includes a thin-film not firmly adhering to a substrate, such heat generation causes an impaired appearance of the portion having suffered the local breakdown, but such does not significantly impair reliability of the module when small current flows through the cells. However, since a module having a large area generally outputs large electric current, local large current flows in the cell having suffered the local breakdown. As a result, a metallic electrode layer in the cell melts and the entirety of the cell can be destroyed in the end.

A well known approach to avoid such a disadvantage is to connect bypass diodes each in antiparallel to at least one of a plurality of photoelectric conversion cells connected in series. More specifically, if a photoelectric conversion cell is shaded, a bypass diode connected in antiparallel to the cell can serve to pass electric current generated in the other cells connected in series to the shaded cell. In other words, as a threshold voltage in a diode formed of a thin-film is about one tenth of its reverse breakdown voltage, reduction of output in a photoelectric conversion module can thus be made very small.

U.S. Pat. No. 6,013,870 discloses forming a bypass diode in the same layer structure as a thin-film photoelectric conversion cell formed on a main surface of a substrate. It describes that an uneven boundary of a front electrode layer is formed between a cell and an adjacent bypass diode, that a protruding edge portion of the front electrode layer of the cell overlaps and is connected to a back electrode layer of the diode, and that a protruding edge portion of the front electrode layer of the diode overlaps and is connected to the back electrode layer of the cell. Then, the diode can be connected to the cell in antiparallel.

In this method, however, the photoelectric conversion cell and the diode are formed adjacent to each other and thus there is a possibility that formation process of the diode may damage the cell. Further, since the method requires forming the boundary pattern having small protrusions and depressions in the electrode layer and the patterning is time-consuming, the method is not suitable for practical production. Furthermore, there is a serious problem in the method that a "reverse bias treatment" of cells cannot be carried out, as will be described hereinafter.

Regarding an integrated thin-film photoelectric conversion module having a large area, it is generally known that conditions of depositing thin layers, patterning the layers with a laser beam for integration, and the like are likely to cause local short circuit defects between first and second electrode layers sandwiching a semiconductor layer and thus likely to cause insufficient output characteristics in the module. Accordingly, for example, Japanese Patent Laying-Open No. 10-4202 teaches to burn out and remove the local short circuit defects, wherein voltage reverse to output voltage of the cells is applied between the second electrodes of adjacent cells connected in series. This is generally referred to as a "reverse bias treatment" of a cell.

In a case that series-connected thin-film photoelectric conversion cells each with a bypass diode connected in antiparallel thereto are integrally formed on a substrate as in U.S. Pat. No. 6,013,870, if a cell is to be supplied with the reverse voltage in the reverse bias treatment, then the bypass diode would receive forward voltage. More specifically, the bypass diode receives forward current flowing therethrough in the reverse bias treatment of the cell and thus sufficient voltage would not be applied to remove the short circuit defects in the cell. In such a case, if large voltage is forced to be applied to the cell, then the bypass diode would be destroyed by excessively large forward current flowing therethrough.

In general, an integrated thin-film photoelectric conversion module has a plurality of thin-film photoelectric conversion cells connected mutually in series on a glass substrate. Each cell is formed by depositing a front transparent electrode layer, a thin-film photoelectric conversion unit and a second electrode layer on the glass substrate and subsequently patterning the layers for integration.

For such an integrated thin-film photoelectric conversion module, there still exists a demand for improved photoelectric conversion efficiency. A tandem structure includes a stack of a plurality of thin-film photoelectric conversion units each having a different absorption wavelength range between a front transparent electrode and a back electrode, and it is known as a structure capable of photoelectricly converting incident light in improved efficiency.

One type of tandem structure is a hybrid structure, which includes a stack of a plurality of photoelectric conversion units including photoelectric conversion layers having different crystalinities. For example, a thin-film photoelectric conversion unit closer to a light receiving side (or a front side) includes a photoelectric conversion layer formed of an amorphous silicon layer having a wide bandgap and a thin-film photoelectric conversion unit closer to a backside includes a photoelectric conversion layer formed of a poly-silicon layer having a narrow bandgap.

For material such as silicon, a crystalline layer formed on a substrate for example through plasma chemical vapor deposition (CVD) contains residual stress much greater than that in an amorphous layer. Residual stress of a film counteracts adhesion of the film to a base. More specifically, apparently measurable adhesion of a thin-film to a base is the true adhesion at the interface minus the effect of the residual stress of the film. In an integrated hybrid thin-film photoelectric conversion module, therefore, effective adhesion of a semiconductor layer to a base is reduced and then the reduced effective adhesion further notably impairs an impaired appearance of a portion having suffered dielectric breakdown due to the aforementioned hot spot phenomenon.

SUMMARY OF THE INVENTION

In view of the prior art as described above, an object of the present invention is to provide an integrated thin-film photoelectric conversion module capable of achieving high output and high reliability and particularly to provide a highly reliable integrated hybrid thin-film photoelectric conversion module fabricable rather simply and inexpensively.

According to an aspect of the present invention, an integrated thin-film photoelectric conversion module includes a multi-layered film including a first electrode layer, a semiconductor layer and a second electrode layer stacked on a main surface of a substrate. The multi-layered film includes a cell region including a plurality of photoelectric conversion cells connected in series, a bypass diode region and a connection region. When the cell is subjected to reverse bias treatment, the connection region does not connect the bypass diode to the cell. After the cell is subjected to the reverse bias treatment, the connection region connects the bypass diode in antiparallel to at least one of the cells connected in series.

Preferably, the connection region has the first electrode layer and the second electrode layer short-circuited to enable the reverse bias treatment of the bypass diode. Further preferably, before the reverse bias treatment of the cell, the connection region has the first electrode layer and the second electrode layer short-circuited by a conductive material applied in a gap extending from the second electrode layer to the first electrode layer.

In the reverse bias treatment, on the other hand, connection of the connection region to the cell is preferably cut by a gap penetrating the multi-layered film.

Preferably, selected one of the cells connected in series has the second electrode layer continuous to the second electrode layer of the connection region and also connected to the first electrode layer of the connection region by a conductive material applied after the reverse bias treatment to fill the gap penetrating the multi-layered film. The connection region has the first electrode layer continuous to the first electrode layer of the bypass diode. The bypass diode has the second electrode layer continuous to the second electrode layer of the cell different from the selected cell.

In the cell region, each of the cells can have an elongated rectangular geometry and the cells can be connected in series in a direction of the minor axis thereof. Gaps can be provided between the cell region, the bypass diode region and the connection region for adjusting electric connections. Each of the gaps can be formed in linear line segment parallel to the minor or major axis of the rectangular cell.

One or two of the bypass diodes can be provided adjacent to one end or both ends of the major axis of the cell. Further, the cell region can include more than one array of the cells connected in series, the arrays being connected in parallel, between two adjacent the arrays there being arranged the bypass diode connected in antiparallel through the connection region to both the same numbers of the cells in the two adjacent arrays.

The module can include the semiconductor layer including an amorphous photoelectric conversion layer and a crystalline photoelectric conversion layer arranged in tandem.

According to another aspect of the present invention, a method of fabricating the integrated thin-film photoelectric conversion module, includes the steps of applying reverse bias voltage between the second electrode layer of one of the cells and that of another cell adjacent to the one cell or between the second electrode layer of the bypass diode and that of the connection region adjacent to the bypass diode to eliminate short circuit defects in at least one of the cell and the bypass diode, and then applying conductive material in the gap penetrating the multi-layered film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6A is an enlarged cross section of the FIG. 3 module taken along a line VIA—VIA, FIG. 6B is an enlarged cross section of the FIG. 3 module after reverse bias treatment of cells, taken along a line VIB—VIB, and FIG. 6C is an enlarged plan view of a diode region of FIG. 3;

DESCRIPTION OF THE PREFERRED EMBODIMENTS

Figure 1:
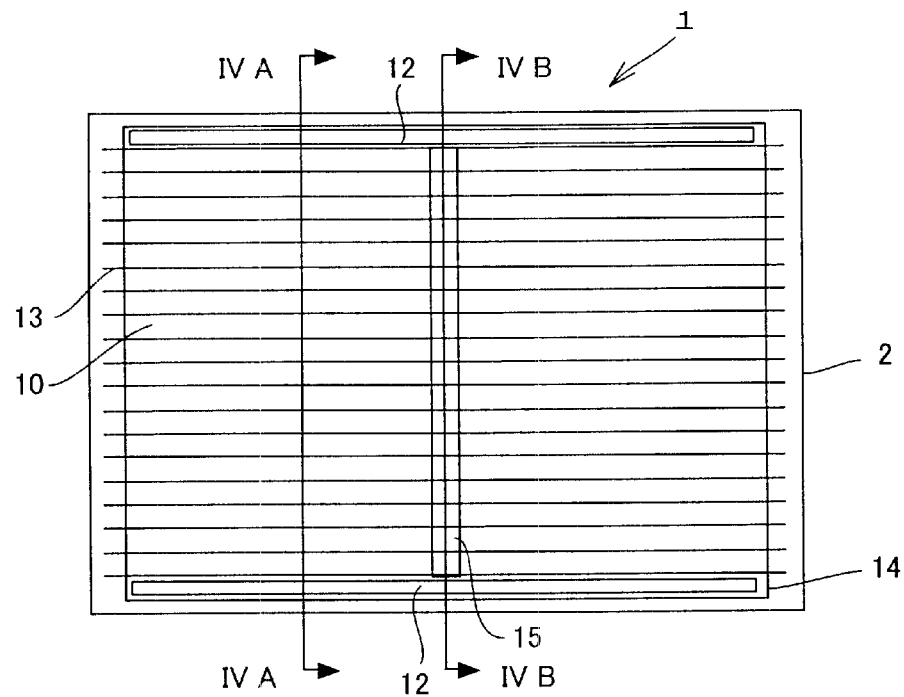
FIG. 1 is a schematic plan view of an integrated thin-film photoelectric conversion module according to an embodiment of the present invention.

In order to improve the aforementioned disadvantage in the prior art, the present inventors have studied the following matters.

Initially, a photoelectric conversion cell and a bypass diode can basically be formed with the same layered structure. As such, if a multi-layered film for a cell and that for a diode can be deposited simultaneously, it becomes possible to readily and inexpensively fabricate a practical integrated thin-film photoelectric conversion module by integrally forming a cell region and a diode region.

Even in a case that a cell region and a diode region are formed integrally, before a bypass diode is connected in antiparallel to at least one of photoelectric conversion cells connected in series, the cell and the bypass diode can be subjected to reverse bias treatment.

As has been described previously, since a thin-film included in an integrated hybrid thin-film photoelectric conversion module contains a crystalline layer, effective adhesion of the film to a substrate is weak. Further, an integrated amorphous thin-film photoelectric conversion module has a breakdawn voltage of 8 to 9V when hot spot phenomenon occurs, whereas an integrated hybrid thin-film photoelectric conversion module has a high breakdown voltage of about 12 to 14V and each cell's open-circuit voltage (Voc) is as high as about 1.3 to 1.4V, which further notably impairs an impaired appearance of a portion having suffered dielectric breakdown due to hot spot phenomenon. As such, it would be a more essential solution to reduce the exact reverse voltage applied to a shaded hybrid thin-film photoelectric conversion cell when hot spot phenomenon occurs by connecting a bypass diode in antiparallel to the cell, rather than to divide a series-connected array containing cells connected in series into a plurality of series-connected arrays in parallel and connects the resultant arrays in parallel to alleviate current obstruction caused by the shaded cell.

If the bypass diode that is connected in antiparallel for each predetermined number of cells connected in series and also receives light has a smaller area than the predetermined number of cells, the integrated thin-film photoelectric conversion module is free of significantly reduced short circuit current (Isc). Further, when the module is fabricated and installed, it is difficult to make the module's entire surface receive light and then a shaded area results inevitably. The diode can preferably be formed in such a shaded area.

Hereinafter embodiments according to the present invention will more specifically be described with reference to the drawings. Note that like reference characters denote like components in the figures.

Figure 2:
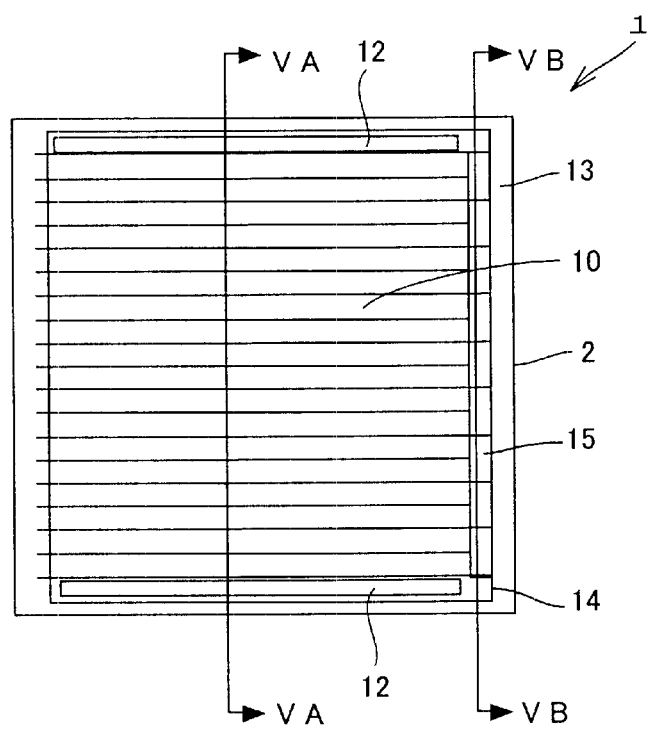
FIG. 2 is a schematic plan view of the integrated thin-film photoelectric conversion module according to another embodiment of the present invention.
Figure 3:
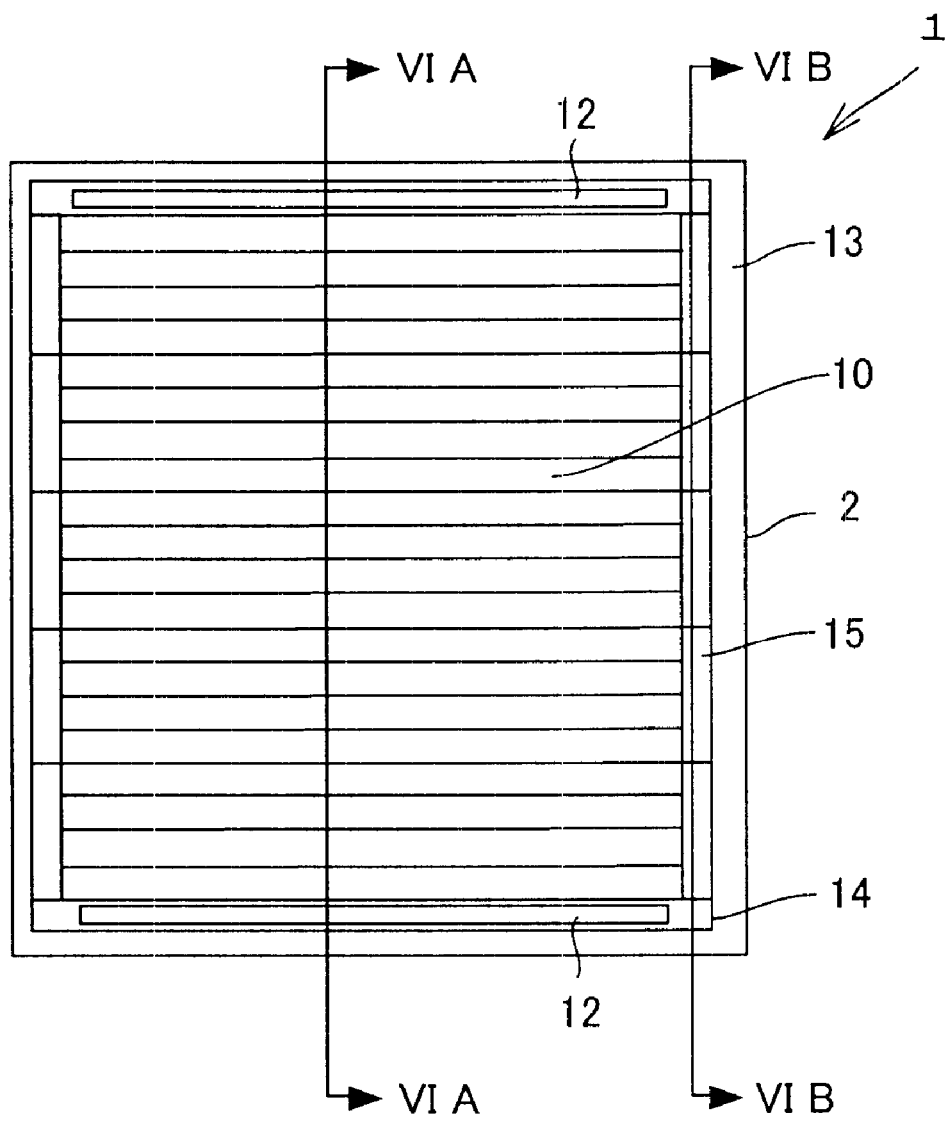
FIG. 3 is a schematic plan view of the integrated thin-film photoelectric conversion module according to still another embodiment of the present invention.

FIGS. 1, 2 and 3 are plan views schematically showing integrated thin-film photoelectric conversion modules according to embodiments of the present invention. In each of these figures, an integrated thin-film photoelectric conversion module 1 has a cell region in which a plurality of thin-film photoelectric conversion cells 10 are integrated on a substrate 2. More specifically, a plurality of elongated rectangular photoelectric conversion cells 10 are connected in series in the direction of their minor axis and the cells at opposite ends are in contact with a pair of bus bar electrodes 12 formed of copper foil. Further, a bypass diode region 15 (including a connection region for connecting a bypass diode to a cell in antiparallel) is arranged on substrate 2 parallel to the direction in which cells 10 are connected in series. These cells 10, bus bar electrode 12 and bypass diode region 15 are separated by a periphery separation gap 14 from the module's peripheral region 13.

In FIG. 1, there exists an array of cells 10 connected in series on each side of bypass diode region 15 and then a diode (including a connection region) is connected in antiparallel to an adjacent cell 10 in each array. In FIG. 2, bypass diode region 15 is arranged along one end of the major axis of each cell 10 in a cell array and one diode is connected in antiparallel to two cells 10 connected in series. In FIG. 3, two bypass diode regions 15 are arranged along both ends of the major axis of each cell 10 in a cell array and then one diode is connected in antiparallel to four cells 10 in connected in series.

Figure 4A:
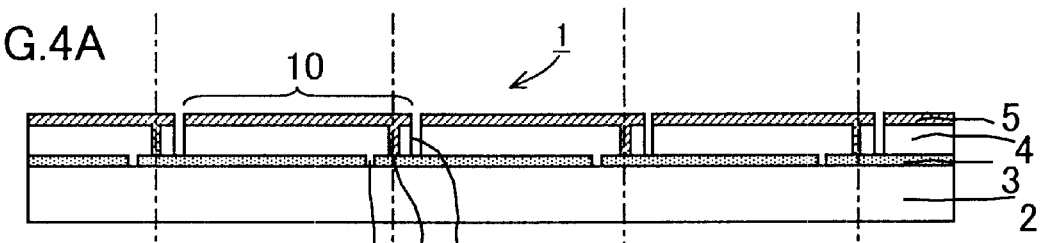
FIG. 4A is an enlarged cross section of the FIG. 1 module taken along a line IVA—IVA.
Figure 4B:
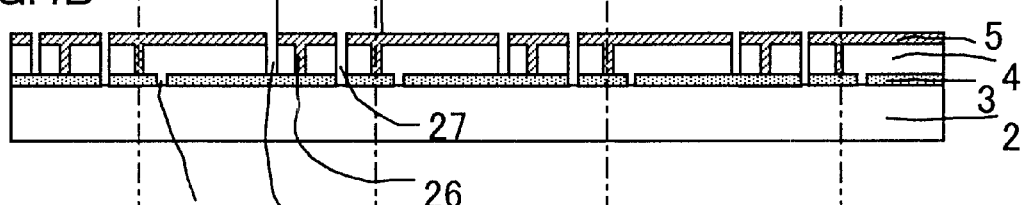
FIG. 4B is an enlarged cross section of the FIG. 1 module before reverse bias treatment of cells, taken along a line IVB—IVB.
Figure 4C:
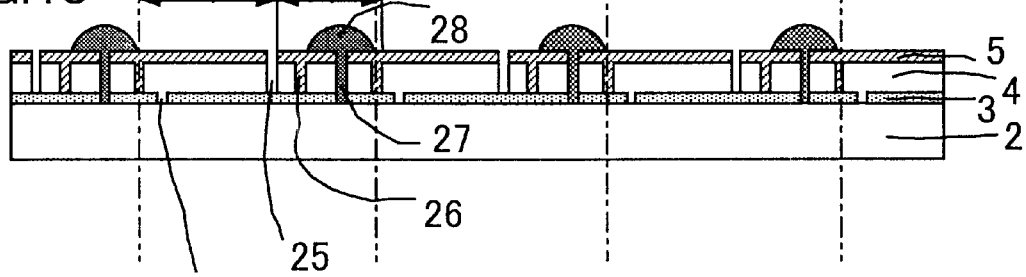
FIG. 4C is an enlarged cross section of the FIG. 1 module after the reverse bias treatment of the cells, taken along line IVB—IVB.
Figure 4D:
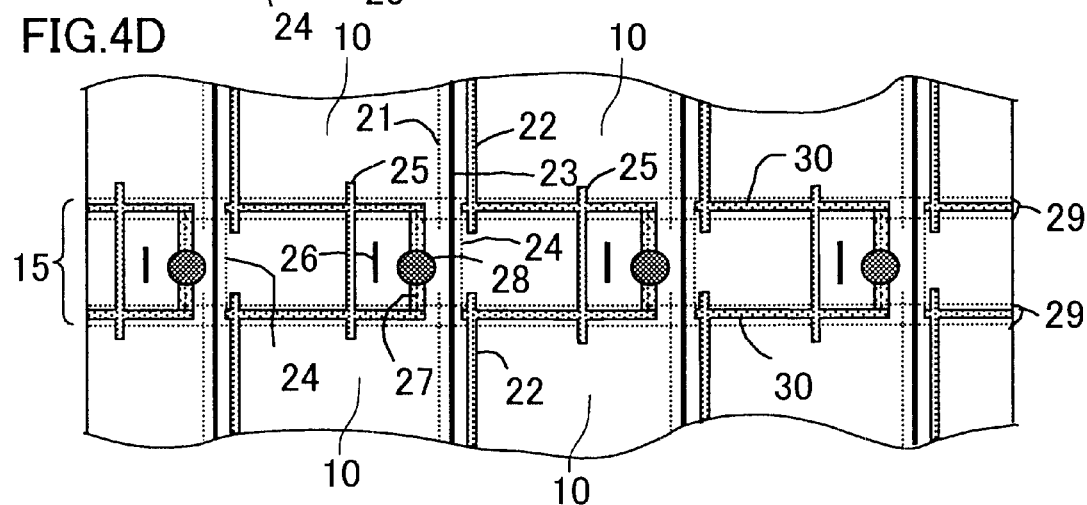
FIG. 4D is an enlarged plan view of a diode region of FIG. 1.
Figure 5A:
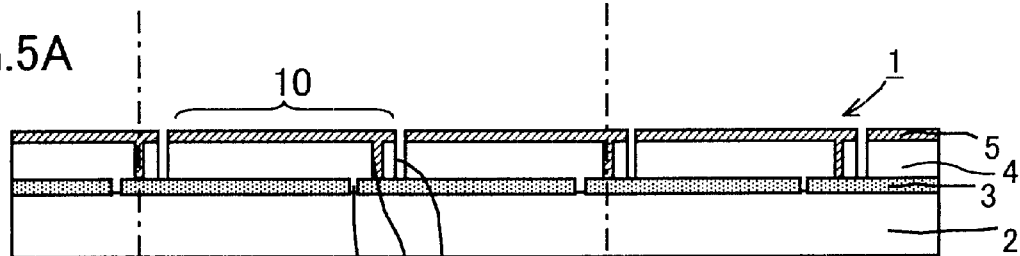
FIG. 5A is an enlarged cross section of the FIG. 2 module taken along a line VA—VA.
Figure 5B:
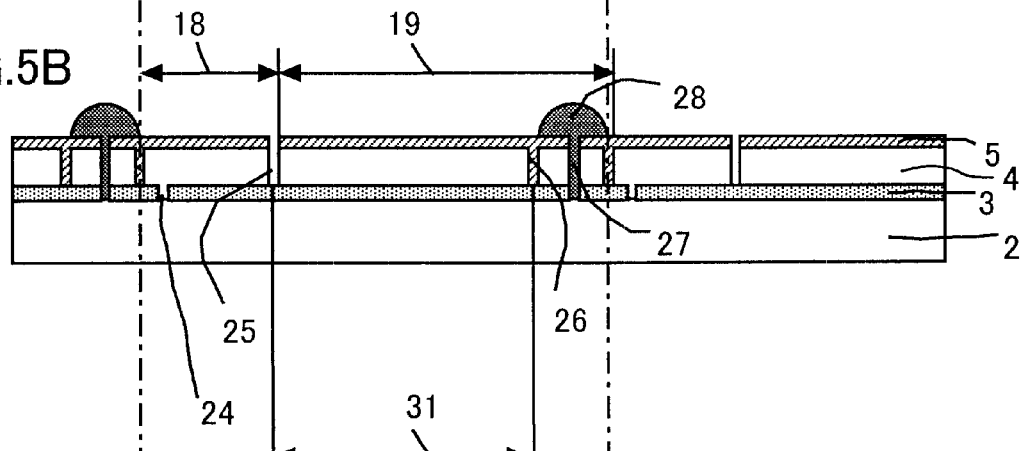
FIG. 5B is an enlarged cross section of the FIG. 2 module after reverse bias treatment of cells, taken along a line VB—VB.
Figure 5C:
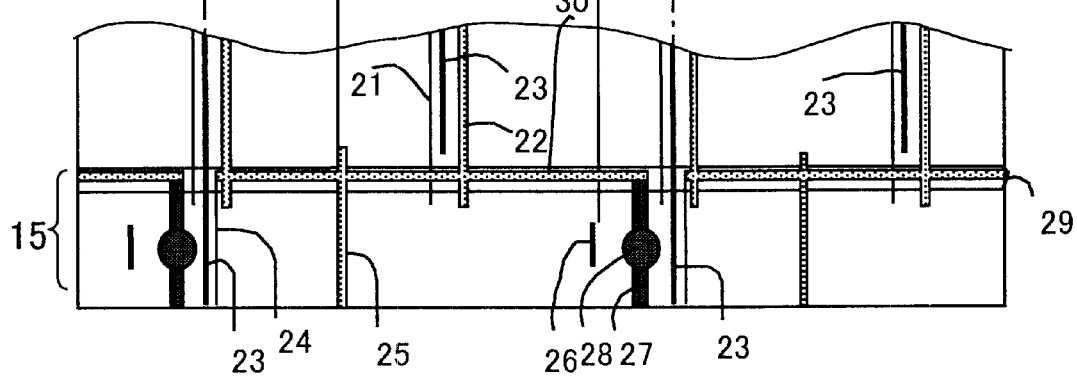
FIG. 5C is an enlarged plan view of a diode region of FIG. 2.

In FIG. 4A, thin-film photoelectric conversion cells 10 connected in series in FIG. 1 are shown in an enlarged cross section taken along a line IVA—IVA. In FIGS. 4B and 4C, bypass diode region 15 of FIG. 1 is shown in an enlarged cross section taken along a line IVB—IVB. In FIG. 4B, cells 10 are not yet subjected to reverse bias treatment. In FIG. 4C, they have undergone the reverse bias treatment. FIG. 4D is an enlarged plan view of a vicinity of bypass diode region 15 of the FIG. 1 module rotated by 90 degrees in its plane. Note that FIGS. 4A–4D only show a portion of module Similarly, FIG. 5A is an enlarged cross section of the FIG. 2 module taken along a line VA—VA. FIG. 5B is an enlarged cross section of the FIG. 2 module taken along a line VB—VB. FIG. 5C is an enlarged plan view of a vicinity of bypass diode region 15 of FIG. 2. Further, FIG. 6A is an enlarged cross section of the FIG. 3 module taken along a line VIA—VIA. FIG. 6B is an enlarged cross section of the FIG. 3 module take along a line VIB—VIB. FIG. 6C is an enlarged plan view of a vicinity of bypass diode region 15 of FIG. 3.

As shown in FIGS. 4A, 5A and 6A, a thin-film photoelectric conversion cell 10 in a module 1 has a structure in which a first electrode layer 3, a semiconductor layer 4 and a second electrode layer 5 stacked successively on a substrate 2. Light introduced in module 1 from the substrate side or the second electrode layer side is photoelectricly converted by at least one photoelectric conversion unit included in semiconductor layer 4.

A glass plate or a transparent resin film, for example, can preferably be used for substrate 2. However, substrate 2 is not limited thereto and it may be any substrate that has an insulative surface.

In a case that light is introduced into the semiconductor layer 4 from the substrate side, first electrode layer 3 can be formed with ITO (indium-tin oxide), $SnO_2$, ZnO or other similar transparent conductive oxide (note that if light is introduced into semiconductor layer 4 from the second electrode side, first electrode layer 3 can be formed with silver, aluminum or other similar metal). First electrode layer 3 may have either a monolayer structure or a multi-layered structure and can be formed through evaporation, chemical vapor deposition, sputtering or other similar vapor-phase deposition. It is preferable that first electrode layer 3 has a textured surface structure including fine unevenness. First electrode layer 3 having a textured surface can improve entering-efficiency of light into semiconductor layer 4 including at least one photoelectric conversion unit.

In semiconductor layer 4, it is possible to form, for example, an amorphous thin-film photoelectric conversion unit including an amorphous photoelectric conversion layer, or a crystalline thin-film photoelectric conversion unit including a crystalline photoelectric conversion layer. Further, semiconductor layer 4 may be formed as a tandem type including amorphous and crystalline thin-film photoelectric conversion units. In this case, the amorphous photoelectric conversion unit can include, for example, a p-type silicon-based semiconductor layer, a non-doped silicon-based amorphous photoelectric conversion layer and an n-type silicon-based semiconductor layer stacked successively from the first electrode side, and the crystalline photoelectric conversion unit can include, for example, a p-type silicon-based semiconductor layer, a non-doped silicon-based crystalline photoelectric conversion layer and an n-type silicon-based semiconductor layer stacked successively over the amorphous photoelectric conversion unit. Any of these semiconductor layers can be formed through plasma CVD.

Second electrode layer 5 not only functions as an electrode but also serves as a reflection layer which receives light reaching from the substrate side through semiconductor photoelectric conversion layer 4 and reflects the light again into semiconductor layer 4. Second electrode layer 5 can be formed with silver, aluminum or the like through vapor deposition, sputtering or the like. (Note that if light is introduced through second electrode layer 5 into semiconductor layer 4, second electrode layer 5 can be formed with ITO, SnO$_2$, ZnO or other similar transparent conductive oxide.) A transparent conductive thin-film (not shown) of ZnO or other similar non-metallic material, for example, may be inserted between second electrode layer 5 and semiconductor layer 4 to enhance adhesion therebetween. In thin-film photoelectric conversion module 1, an organic protection layer (not shown) is joined on second electrode layer 5, with a sealing resin layer (not shown) interposed therebetween.

As shown in each of FIGS. 4A, 5A and 6A, integrated thin-film photoelectric conversion module 1 is provided with a gap 21 dividing first electrode layer 3 into a plurality of first electrodes, a gap 22 dividing second electrode layer 5 into a plurality of second electrodes, and a gap 23 provided for connecting adjacent cells 10 in series. Gaps 21, 22 and 23 are parallel to each other and extend in a direction perpendicular to the drawing sheet. The gap for connection 23 is filled with the same metal material as second electrode 5 and it is used to connect the first electrode of a cell to the second electrode of an adjacent cell.

In FIGS. 4A through 4D, cells 10 connected in series in one cell array each are connected to one bypass diode 18 via connection region 19 in antiparallel. In FIGS. 5A through 5C, two cells 10 connected in series are connected to one bypass diode 18 via connection region 19 in antiparallel. In FIGS. 6A through 6C, four cells 10 connected in series are connected to one bypass diode 18 via connection region 19 in antiparallel.

More specifically, the first electrode of diode 18 has one side formed by a gap for separation 24 (note that in FIGS. 6B and 6C, gap 21 also serves as gap 24). Between diode 18 and connection region 19, second electrode layer 5 is divided by gap 25. In connection region 19, first and second electrodes 3 and 5 are short-circuited through gap 26 filled with the same conductive material as second electrode 5. Connection region 19 is divided by a gap 27 penetrating first electrode layer 3 through second electrode layer 5 in the region. Gaps 24–27 can be formed parallel to a direction of a major axis of rectangular cell 10.

As shown in FIGS. 4D, 5C and 6C, between a region of cells 10 and bypass diode region 15, first electrode layer 3 is divided by a gap 29. Further, a gap 30 extending along gap 29 penetrates at least second electrode layer 5. Gaps for separation 29 and 30 can be formed parallel to a direction of a minor axis of rectangular cell 10.

As can be understood with reference in detail to FIGS. 4A through 6C, after reverse bias treatment, second electrode 5 of cell 10 that is continuous to that of connection region 19 is also connected to first electrode layer 3 of connection region 19 by conductive material 28 filling gap 27. First electrode 3 of connection region 19 is continuous to that of diode 18. Second electrode 5 of diode 18 is continuous to that of cell 10 adjacent to the diode.

In reverse bias treatment, connection region 19 is divided by gap 27 penetrating first electrode layer 3 through second electrode layer 5 (see FIG. 4B). More specifically, when gap 27 is not filled with conductive material 28, connection region 19 does not connect bypass diode 18 to cell 10. As such, by applying reverse voltage between second electrodes 5 of adjacent cells 10 with voltage applying probes, one of the cells can be subjected to reverse bias treatment. Since first electrode 3 continuous between bypass diode 18 and connection region 19 is short-circuited to second electrode 5 of connection region 19 via conductive material in gap 26, bypass diode 18 can also be subjected to reverse bias treatment by bringing the voltage applying probes in contact with the second electrode of bypass diode 18 and that of connection region 19.

As shown in FIGS. 4D, 5C and 6C, gap for separation 21 is extended to reach at least gap for separation 29 in order to prevent short circuit of first electrodes 3 between adjacent cells 10. Similarly, gap for separation 22 is extend to reach at least gap for separation 30 in order to prevent short circuit of second electrodes 5 between adjacent cells 10. In a region where gap for separation 30 is not formed maintaining continuity between second electrode 5 of diode 18 or connection region 19 and second electrode 5 of cell 10, gap for connection 23 is extended across gap for separation 29. In a region where gap for separation 30 is formed, however, gap 23 must not be extended across gap 29 and preferably does not reach gap 29. If gap 23 extends on first electrode 3 of diode 18 or connection region 19, first electrodes 3 of adjacent cells 10 can be short-circuited through first electrode 3 of diode 18 or connection region 19.

Integrated thin-film photoelectric conversion module 1 as aforementioned can be fabricated for example by the following method. Initially, a first electrode layer 3 is deposited on a main surface of substrate 2. First electrode layer 3 is then laser-scribed to form gaps for separation 21, 24 and 29. Subsequently, a semiconductor layer 4 is deposited on first electrode layer 3 and laser-scribed to form gaps for connection 23 and 26. Further, a second electrode layer 5 is deposited on semiconductor layer 4. When second electrode layer 5 is deposited, gaps 23 and 26 are filled with the same metal material as the second electrode layer and then second and first electrode layers 5 and 3 are electricly connected together.

Semiconductor layer 4 and second electrode layer 5 are laser-scribed to form gaps for separation 22, 25 ad 30. Further, first electrode layer 3, semiconductor layer 4 and second electrode layer 5 are laser-scribed to form a gap 27 dividing connection region 19 and a peripheral isolation gap 14 (see FIGS. 1–3). Then, by applying reverse bias voltage between second electrodes 5 of adjacent cells 10, reverse bias treatment is carried out to remove short circuit defects in one of the cells. Furthermore, by applying reverse bias voltage between second electrode 5 of diode 18 and second electrode 5 in a vicinity of gap for short circuit 26 in connection region 19, reverse bias treatment is carried out to remove short circuit defects in the diode.

Thereafter, gap 27 is filled with a conductive material 28, a pair of bus bar electrodes 12 are formed, and then a sealing resin layer and an organic protection layer are simultaneously stuck over second electrode layer 5 by means of vacuum lamination. Conductive material 28 can be silver paste hardened, carbon paste hardened, solder, or the like. As described above, integrated thin-film photoelectric conversion modules such as shown in FIGS. 1 through 6C can thus be obtained.

In a case that one bypass diode is connected in reverse to n cells connected in series in an integrated thin-film photoelectric conversion module of the present invention, if the n cells are receiving light, then the bypass diode would receive reverse voltage of about n×Vc from the n cells, where Vc represents open-circuit voltage per cell. As such, if the diode's reverse breakdown voltage is represented as Vd, then at least a relation Vd>n×Vc must be satisfied and preferably Vd>2n×V be satisfied.

When the module is partially shaded, it provides reduced overall output. To minimize the reduction, n equal to one is the most preferable. On the other hand, n greater than one can reduce the number of bypass diodes to be fabricated and thus the module can simply and readily be fabricated. However, if n is too large a number, the bypass diode receives increased reverse bias voltage and then fill factor (FF) of the whole module would undesirably be reduced due to the diode's leakage current.

As has been described previously, in an integrated hybrid thin-film photoelectric conversion module, semiconductor layer 4 includes a crystalline layer and has weak adhesion to a base and further its breakdown voltage when hot spot phenomenon occurs is high as 12 to 14V, higher than that (i.e., 8 to 9V) of an integrated amorphous thin-film photoelectric conversion module, and therefore degradation of appearance of a portion having suffered dielectric breakdown due to hot spot phenomenon becomes more significant. In other words, a bypass diode in the present invention can bring about a superior effect particularly for an integrated hybrid thin-film photoelectric conversion module.

When module 1 of the present invention illuminated with light includes a shaded cell 10 and output current flows through bypass diode 18, a series resistance between cell 10 and bypass diode 18 would become a problem. The series resistance is attributed to resistance related to a distance from diode 18 to a distal end of cell connected thereto, resistance related to the narrowest portion of the second electrode layer 5 continuous between a cell and a diode or between a cell and connection region 19, and resistance related to the diode itself.

For a module of a large area, the distance from diode 18 to a distal end of cell 10 connected thereto can be reduced as follows. In a module of the present invention, instead of connecting one diode in antiparallel to n cells in a plurality of cells connected in series as shown in FIG. 2, it is possible to connect one diode antiparallel to one or n cells connected in series in cell arrays juxtaposed on both sides of the diode as shown in FIG. 1. Further, in the module of the present invention, the major side of the rectangular cell preferably has a length of less than 100 cm, more preferably less than 50 cm, still more preferably less than 25 cm.

While gap for separation 29 having a larger width is preferable for stably fabricating the module, it reduces the module's effective area and hence reduce the module's output. Within possible preciseness of a laser processing apparatus to be used, in the present invention, gap for separation 29 is preferably formed as a set of a plurality of narrow laser-scribed gaps to have a width of less than 5 mm, preferably less than 2 mm, more preferably less than 1 mm, still more preferably less than 0.5 mm.

In a module of the present invention, each diode is connected in antiparallel to n cells connected in series. As such, when the diodes receive light, the module's short circuit current (Isc) is reduced by an amount of electric current generated in the diodes. By making the area of each diode small enough as compared with that of the cell, however, it is possible to prevent output of the module from being significantly reduced. It should be noted, on the other hand, that if the area of each diode is reduced too much, the diode would cause large series resistance to electric current flowing therethrough when a shadow is formed on the module face. As a result, a voltage corresponding to a voltage drop due to the series resistance is applied to the cell and causes hot spot phenomenon and then it is likely that output of the module is lowered more than expected from an area of the shadow despite the diode being connected in parallel to the cell. Accordingly, in the module of the present invention, an area of each diode is preferably 0.05 to 1 $cm^2$, more preferably 0.1 to 0.3 $cm^2$.

Preferably, an external member such as a frame or an opaque film is applied to the module so that the region including the bypass diodes is shaded from solar radiation or free from direct light illumination. Further, the integrated thin-film photoelectric conversion module of the present invention is preferably installed so that the region including the diodes is shaded from solar radiation or free from direct light illumination.

EXAMPLES

The integrated thin-film photoelectric conversion modules shown in FIG. 1 though 6C were fabricated by a method as described in the following. The modules were fabricated with such features in fabrication process and structure as summarized in Table 1.

TABLE 1

|  | Bypass diode | No. of cells No. of diodes n | No. of series cell arrays | Length of longer side of cell | Gap for short circuit in connection region | Reverse bias treatment of cell | Reverse bias treatment of diode | Width of isolation band 29 |
|---|---|---|---|---|---|---|---|---|
| Example 1 | Present | 1 | 1 | 430 mm | Present | Done | Done | 2 mm |
| Example 2 | Present | 1 | 1 | 430 mm | Absent | Done | Not Done | 2 mm |
| Example 3 | Present | 1 | 2 | 215 mm | Present | Done | Done | 2 mm |
| Example 4 | Present | 2 | 1 | 430 mm | Present | Done | Done | 2 mm |
| Example 5 | Present | 4 | 1 | 430 mm | Present | Done | Done | 2 mm |
| Example 6 | Present | 8 | 1 | 430 mm | Present | Done | Done | 2 mm |
| Example 7 | Present | 1 | 1 | 430 mm | Present | Done | Done | 0.5 mm |
| Example 8 | Present | 1 | 1 | 430 mm | Present | Done | Done | 1 mm |
| Example 9 | Present | 2 | 1 | 430 mm | Present | Done | Done | 2 mm |

TABLE 1-continued

|  | Bypass diode | No. of cells No. of diodes n | No. of series cell arrays | Length of longer side of cell | Gap for short circuit in connection region | Reverse bias treatment of cell | Reverse bias treatment of diode | Width of isolation band 29 |
|---|---|---|---|---|---|---|---|---|
| Compar. example | Absent | — | — | 430 mm | — | Done | — | — |

A glass substrate 2 of 910 mm by 455 mm having a main surface provided with a SnO$_2$ film 3 was initially prepared. Then, SnO$_2$ film 3 was scanned from above with an infrared basic wave (IR) pulsed laser beam of yttrium-aluminium-garnet (YAG) to form a gap 21 having a width of 40 μm and dividing SnO$_2$ film 3 into elongated rectangular first electrodes 3 and also form a gap for separation 24 bounding on one side of the first electrode 3 of diode 18. Further, a gap 29 orthogonal to gaps 21 and 24 was formed between a region of cells 10 and a diode region 15 to divide SnO$_2$ film 3. In a case of example 5 corresponding to FIGS. 6A–6C, it is noted that gap 21 extending across gap 29 also serves as gap 24. Gaps 21 parallel to a minor side (455 mm) of rectangular substrate 2 were formed at intervals of 8.9 mm.

In examples 1, 2, 7 and 8, one gap for separation 24 was formed for each gap for separation 21. In example 3, one gap 24 was formed for two gaps 21 provided as two separated line segments on the same straight line (see FIG. 4D). In examples 4 and 9, one gap 24 was formed for two gaps 21 (see FIGS. 5A–5C). In example 5, one gap 24 was formed for four gaps 21 (see FIGS. 6A–6C). In example 6, one gap 24 was formed for eight gaps 21. In a comparative example, gap for separation 24 was not formed. To isolate first electrode layer 3 of diode region 15 from that of the cell region, gap 29 parallel to a major side (910 mm) of rectangular substrate 2 was formed with a couple of laser-scribed gaps each having a width of about 40 to 60 μm and being spaced by 2 mm in examples 1–6 and 9, 0.5 mm in example 7, and 1 mm in example 8.

Thereafter, ultrasonic washing and drying were carried out and then a plasma CVD method was employed to deposit on SnO$_2$ film 3 an amorphous thin-film photoelectric conversion unit 4a (not shown) having a thickness of 300 nm and being included in semiconductor layer 4. Amorphous photoelectric conversion unit 4a includes a non-doped amorphous silicon photoelectric conversion layer interposed between significantly thin p and n layers and thus provides a p-i-n junction. Similarly, a crystalline thin-film photoelectric conversion unit 4b (not shown) of 2000 nm thickness was deposited on amorphous thin-film photoelectric conversion unit 4a. Crystalline photoelectric conversion unit 4b includes a non-doped polycrystalline silicon photoelectric conversion layer.

Then, by laser scribing with a YAG secondary harmonic wave (SHG) pulsed laser beam directed from the glass substrate side, a gap 23 having a width of 60 μm was formed to divide semiconductor layer 4 into a plurality of elongated rectangular regions. Gap 23 and gap 21 had their respective centers spaced by 100 μm. If one bypass diode 18 is connected in antiparallel to n cells 10 connected in series, one of n gaps 23 related to the cells is formed extending across gap 29 and the remaining (n−1) gaps 23 were formed not reaching gap 29. In examples 1 and 3–9, semiconductor layer 4 was similarly laser-scribed to form a gap 26 for short-circuiting first and second electrodes 3 and 5 of connection region 19.

Thereafter, a ZnO film (not shown) and an Ag film successively deposit on semiconductor film 4 by sputtering to form a back electrode layer 5. Then, scanning with a YAG-SGH laser beam introduced from the glass substrate side was carried out to form a gap for separation 22 having a width of 60 μm and dividing semiconductor layer 4 and back electrode layer 5 into a plurality of elongated rectangles. Gaps 22 and 23 had their respective centers spaced by 100 μm. Further, in examples 1–9, similar laser-scribing was carried out to form one gap 25 separating semiconductor layer 4 and back electrode layer 5 for each gap 24 dividing the second electrode layer 5.

A space 31 between gap for separation 25 and gap for short circuit 26 is made 200 μm in examples 1–8 and 12 mm in example 9 (see FIGS. 5B and 5C). Further in examples 1–9, scanning with a YAG-SGH laser beam introduced from the glass substrate side was carried out to scribe semiconductor layer 4 and back electrode layer 5 to form a gap for separation 30 parallel to the major side (910 mm) of the rectangular substrate. In examples 1, 3, 4 and 6–9, similar laser-scribing was carried out to simultaneously scribe SnO$_2$ film 3, semiconductor layer 4 and back electrode layer 5 to form one gap for division 27 for each gap for separation 24. In example 5, gap for division 27 was superposed on gap for separation 21 which extends parallel to and with a distance of about a width of cell 10 from gap for connection 23 extending across gap for separation 29 (see FIG. 6C).

Then, a YAG-IR laser beam and a YAG-SHG laser beam were used to scan along a periphery of substrate 2 to form a peripheral isolation gap 14 penetrating SnO$_2$ film 3, semiconductor layer 4 and back electrode layer 5 and to define a region of cells 10 and bypass diode region 15.

Thus, in each of examples 1, 2, 4–9 and the comparative example, an integrated module was fabricated including hybrid thin-film photoelectric conversion cells 10 each of 8.9 mm×430 mm size connected in series up to 100 stages in a direction parallel to the major side of rectangular substrate 2. In example 3, an integrated module was fabricated including two cell arrays connected in parallel each containing hybrid thin-film photoelectric conversion cells 10 each of 8.9 mm by 215 mm size connected in series up to 100 stages in a direction parallel to the major side of rectangular substrate 2.

Then, a pair of bus bar electrodes 12 were attached to substrate 2. Further, in examples 1–9 and the comparative example, reverse bias treatment of cells 10 was carried out by applying voltage between second electrode 5 of cell 10 and that of adjacent cell 10. Furthermore, in examples 1 and 3–9, reverse bias treatment of diodes 18 was carried out by applying voltage between second electrode layer 5 of diode 18 and second electrode layer 5 in a vicinity of gap for short circuit 26 in connection region 19. Then, an ultrasonic soldering iron was used to apply solder in a spot as conductive material 28 for connecting gap 27 dividing connection region 19.

As described above, integrated thin-film photoelectric conversion modules as shown in FIGS. 1 through 6C were obtained.

For each aforementioned example, a sheet of module 1 was fabricated and electric characteristics of the module were measured in a state of no shadow on the module and in a state of ten center cells in the module being shielded from light and then the module with one cell shielded from light was subjected to a hot-spot test. The results were shown in Table 2.

TABLE 2

|  | Electric characteristics of module (not shaded) | | | | Electric characteristics of module (shaded) | | | | Change in appearance after hot spot test |
| --- | --- | --- | --- | --- | --- | --- | --- | --- | --- |
|  | Voc (V) | Isc (A) | FF (%) | Eff (%) | Voc (V) | Isc (A) | FF (%) | Eff (%) |  |
| Example 1 | 134.8 | 0.443 | 72.7 | 11.34 | 118.6 | 0.439 | 53.7 | 7.31 | None |
| Example 2 | 130.8 | 0.450 | 67.6 | 10.40 | 117.7 | 0.442 | 54.0 | 7.34 | None |
| Example 3 | 134.7 | 0.443 | 72.6 | 11.32 | 119.3 | 0.440 | 65.5 | 8.98 | None |
| Example 4 | 134.6 | 0.443 | 72.0 | 11.22 | 117.8 | 0.440 | 52.1 | 7.06 | None |
| Example 5 | 134.1 | 0.442 | 70.5 | 10.92 | 112.2 | 0.438 | 47.5 | 6.10 | None |
| Example 6 | 133.5 | 0.440 | 67.2 | 10.31 | 104.5 | 0.435 | 40.7 | 4.83 | None |
| Example 7 | 127.2 | 0.439 | 68.2 | 9.95 | 111.5 | 0.430 | 52.4 | 6.56 | None |
| Example 8 | 134.8 | 0.440 | 72.6 | 11.25 | 118.9 | 0.437 | 53.8 | 7.30 | None |
| Example 9 | 134.5 | 0.444 | 71.8 | 11.21 | 117.7 | 0.442 | 49.6 | 6.75 | None |
| Comparative Example | 135.0 | 0.445 | 73.0 | 11.46 | 111.99 | 0.174 | 13.2 | 0.67 | Observed |

Output characteristics as the electric characteristics were examined with a solar simulator of AM1.5 for irradiance of 100 mW/cm$^2$ using a xenon lamp and a halogen lamp as a source of light. They were measured at a temperature of 25° C.

In the hot spot test, one cell (in example 3, two cells connected individually in antiparallel to the same one diode) was shielded from light by black vinyl tape stuck thereon and then module 1 was arranged outdoors with its glass substrate face receiving sunlight at incident angle of more than 80 degrees and was left for one minute when irradiance of 80~100 mW/cm$^2$ (0.8 to 1 SUN) was obtained as measured with a pyranometer. Positive and negative lead wires extended from the pair of bus bar electrodes 12 made of copper foil were short-circuited during the hot spot test. The hot spot test was conducted ten times for one module, each time with a different cell being shielded from light. Then, it was observed whether there was a point at which generally black appearance of the cell's face as seen from the glass face had changed to gray or white. The hot spot tests were conducted at a temperature of 15 to 30° C.

As shown in table 2, any of the modules of examples 1–9 did not show discoloration due to hot spot phenomenon. The modules of examples 1, 3, 4, 8 and 9 each provided an output (Eff: photoelectric conversion efficiency) having a value approximately equivalent to that of the comparative example when they are not shielded from light. Further, when the modules of examples 1–9 have their respective cells of the center ten stages shielded from light, they all held their Eff values higher as compared with the comparative example. This is because one or two bypass diodes 18 are connected in antiparallel to n of cells 10 connected in series in the modules of examples 1–9.

Furthermore, high output can be obtained from the module by providing connection region 19 with gap for division 27 and then filling gap 27 with conductive material 28 after subjecting cell 10 and diode 18 to reverse bias treatment. In example 2, since gap for short circuit 26 was not provided and bypass diode 18 did not undergo reverse bias treatment, output of the module was relatively low when the module was not shaded.

In examples 5 and 6, one bypass diode is connected in antiparallel to every four and eight cells respectively, and productivity has been improved in connecting a diode in antiparallel to the cells, though each of these examples cannot sufficiently prevent a fill factor from lowering due to increased leakage current of the diode and output of the module was relatively low when the module was not shaded.

Further, output of the module was relatively low as compared with example 1, also when the module was partially shaded.

In example 7, since gap for separation 29 had a small width of 0.5 mm, production process of the module can not be done as designed and then cells with insufficient output were formed in places and thus output of the module was relatively lower.

In example 3, an array of cells connected in series was divided into two arrays and then diode region 15 was provided between the two arrays (see FIG. 1). A diode and a distal end of a cell as seen lengthwise were spaced by a distance of half a value of those for examples 1, 2 and 4–9, i.e., 215 mm. More specifically, output current was bypassed through a diode on a reduced route and through reduced resistance. Therefore, when partially shielded from light, the module of example 3 provided higher FF and higher output as compared with example 1 etc.

Examples 1, 4, 5, 6 and 9 were further examined in detail by measuring V-I (voltage-current) characteristics in the following method. Specifically, in darkness, a probe was brought into contact with a center of each of any two adjacent cells and then a curve tracer was used to apply alternating current of 60 Hz to measure a current-voltage curve.

Figure 7:
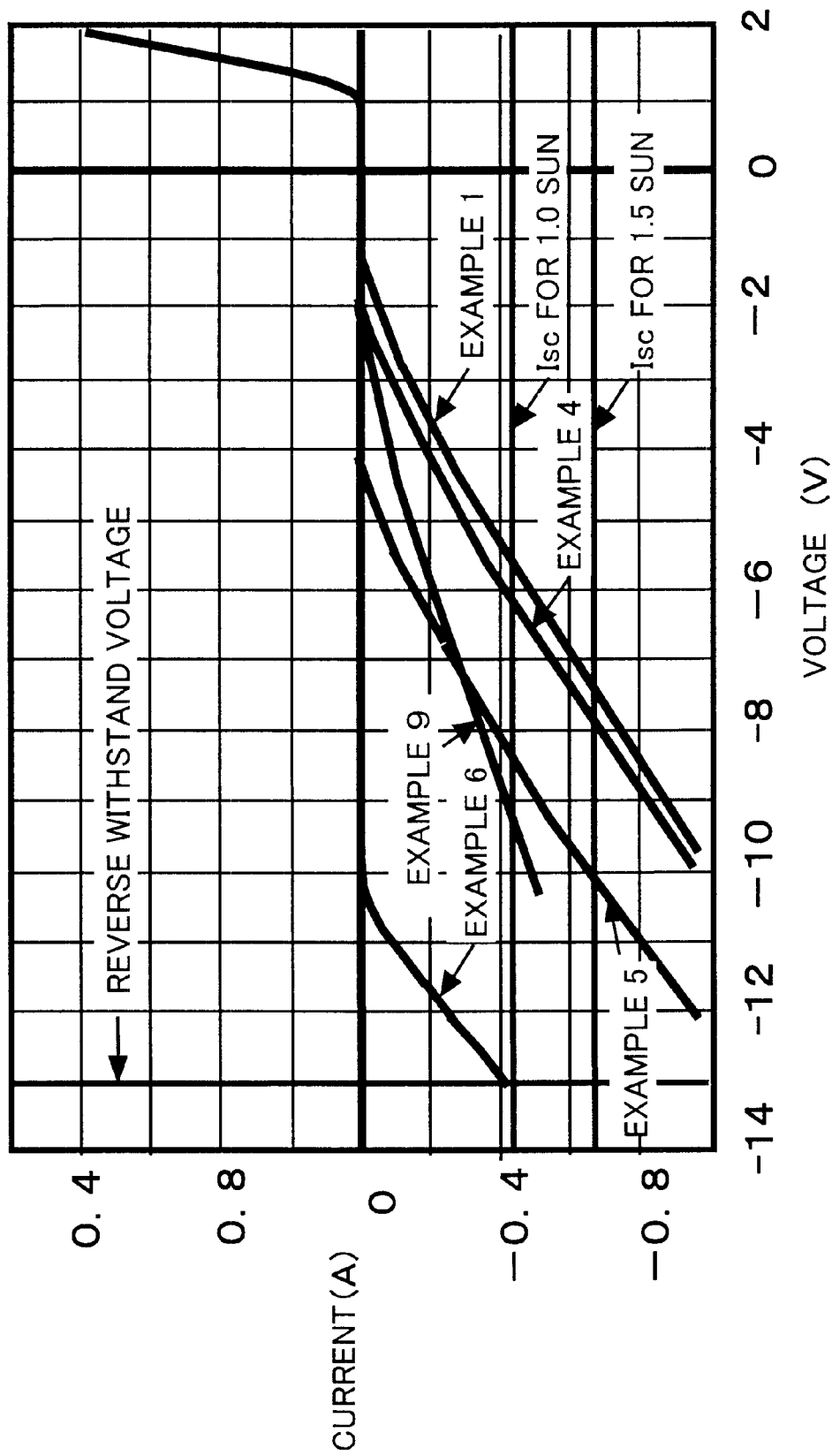
FIG. 7 is a graph showing V-I characteristics regarding examples 1, 4, 5, 6 and 9.

FIG. 7 represents V-I characteristics of examples 1, 4, 5, 6 and 9. It can be understood from this figure that, in example 6, voltage substantially equal to reverse withstand voltage needs to be applied to allow a cell to have short circuit current (Isc) flowing therethrough. This condition corresponds to a condition with n equal to 8 that is just before a cell shielded from light can no longer obstruct photoelectric current generated in cells connected thereto. As such, if a quantity of light is increased and larger than 1 SUN, there is a possibility that a hot spot is caused.

Further, outdoor sunlight irradiance in fine weather with air absorbing less light can have a value of about 1.2 SUN and further it could be about 1.5 SUN if the module is surrounded for example by buildings reflecting light. Thus, a value of n is desirably in a range of $n<(1/2)\times(Vd/Vc)$, where sufficient V-I characteristics can be obtained for 1.5 SUN, as in example 5.

In example 9, when reverse bias voltage is applied, reverse electric current increases with a gradient quite different in tendency as compared with examples 1, 4, 5 and 6. This is because distance 31 (see FIGS. 5B and 5C) is greater in example 9, and it results from a voltage drop due to resistance of the transparent conductive film serving as the first electrode layer 3. In other words, the large distance 31 is disadvantageous when large bypass current is needed to flow in a case of high sunlight irradiance.

Figure 8:
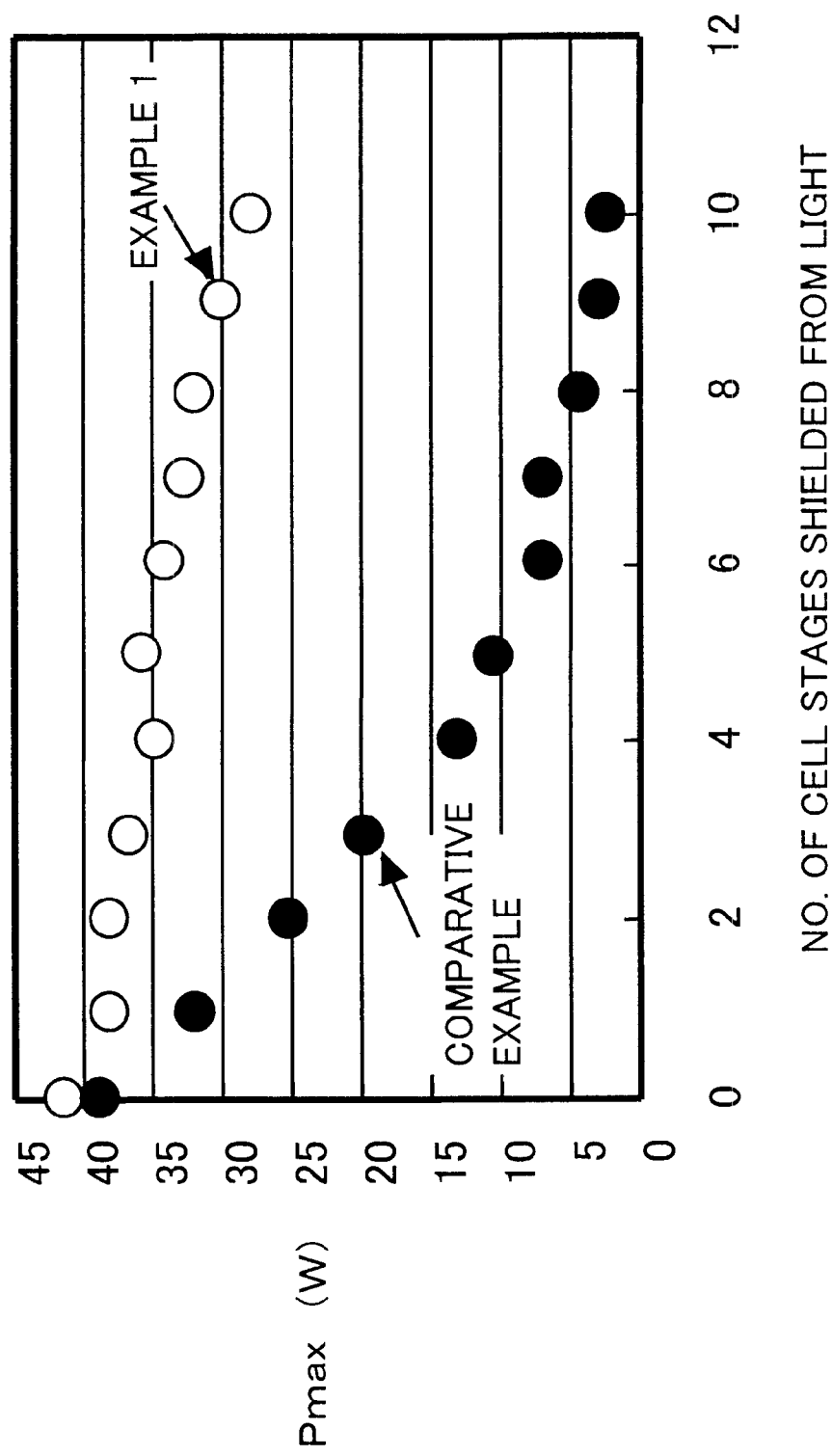
FIG. 8 is a graph showing results of output tests in states partially shielded from light in example 1 and a comparative example.

The modules of example 1 and the comparative example were partly shielded from light and subjected to output tests. Results thereof are shown in a graph of FIG. 8. In the tests, one or more cells within ten from an edge of substrate 2 were shielded from light by black vinyl tape stuck thereon. When irradiance of 90±5 mW/cm$^2$ (0.85 to 0.95 SUN) was obtained outdoors as measured with a pyranometer, module 1 was arranged with its glass substrate face receiving sunlight at incident angle of more than 80 degrees. Output of the modules were measured with the area shielded from light being changed. Incidentally, the modules were tested at a temperature of 15 to 30° C. Example 1 with 10 out of 100 cell stages being shielded from light still had a maximal output (Pmax) of more than 70% of that with no shielding from light. In the module of the comparative example, on the other hand, output was reduced by about 10% as the shielded area is increased by one cell stage. When ten cell stages were shielded from light, the module had substantially no output.

Further, the example 1 module underwent a test based on IEC 1730 INTERNATIONAL STANDARD "PV MODULE SAFETY QUALIFICATION TESTING (WG2 Working Draft)", 11.3.1-11.13.4, which has been proposed to evaluate thermal design and long-term reliability of a bypass diode used to alleviate a negative effect on a solar battery module that is caused by the hot spot phenomenon. In this test, a diode temperature TJ75 expected when a module is actually exposed to sunlight is required to be less than a maximal, reference diode temperature set by the manufacturer of the diode. TJ75 significantly depends on a temperature coefficient δ of a diode voltage drop which is calculated in the process of the test. Normally, a commercially available diode has a coefficient δ of a positive value and it is known that when a constant current is passed forward, the diode temperature increases and the diode voltage drop becomes larger and then the diode generates larger heat. In view of this fact, Japanese Patent Laying-Open No. 2001-119058 for example proposes a terminal box with heat radiation of a bypass diode being taken into consideration to ensure capacity of the diode. However, the example 1 module had its coefficient δ of a negative value of –0.39.

Figure 9:
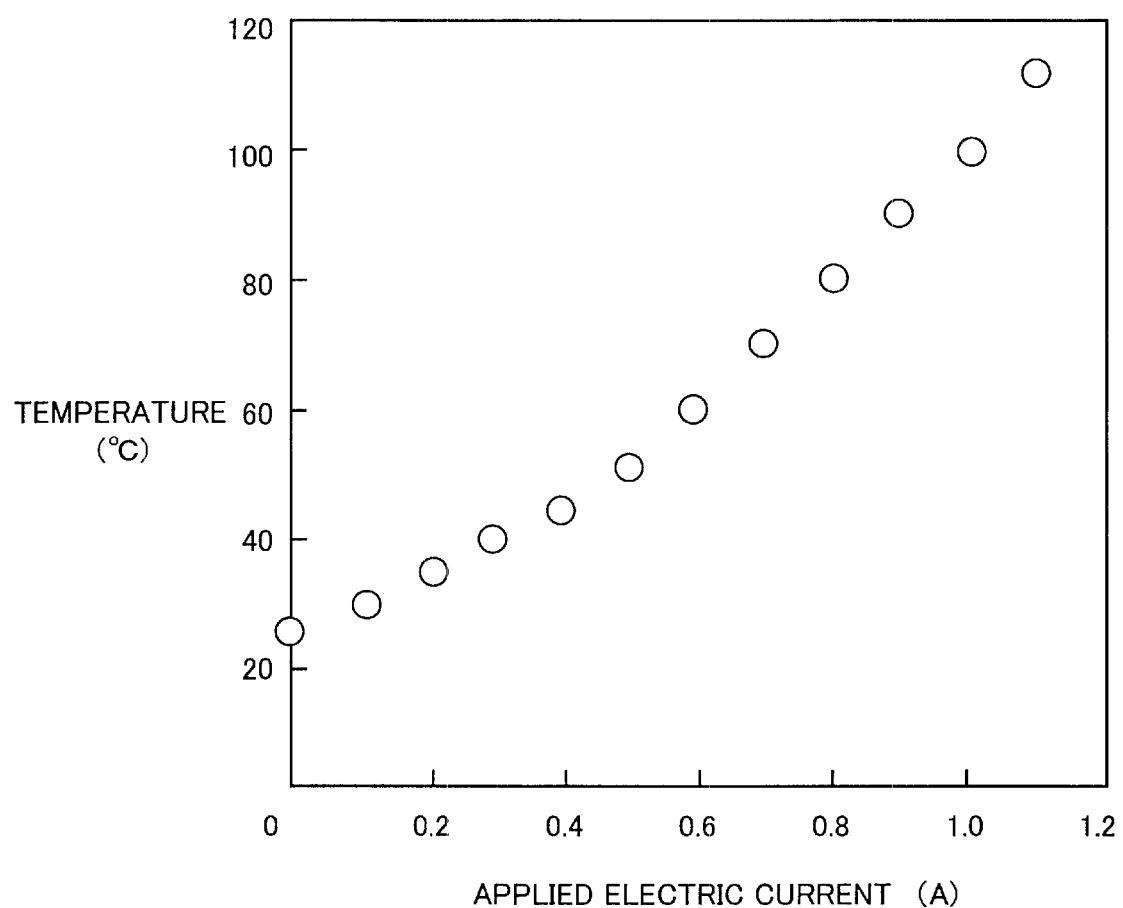
FIG. 9 is a graph showing results of current saturation temperature tests of a bypass diode in example 1.

Furthermore, a diode current saturation temperature test was conducted to examine a thermal property of the example 1 bypass diode. A result thereof is shown in FIG. 9. In the test, the bypass diode temperature was measured with a thermometer of a contact type, while a probe was brought into contact with a center of each of any two adjacent cells of the module. In darkness, a stabilized DC power source was used to pass a constant current to apply forward voltage to the bypass diode (and reverse bias to the cell). When variation of the temperature settled in a range of ±0.5° C. for 30 seconds, the temperature and current of the bypass diode were measured. As shown in FIG. 9, at 0.44A which was a short circuit current of the example 1 module for 1 SUN, the diode had a temperature of less than 50° C., which is lower than a temperature at which a resin for sealing the module starts to change in its quality, i.e., 100° C., and less than a maximal temperature, i.e., 80° C. and an average temperature, i.e., 60° C. at which the module is actually exposed outdoors. Even at 0.66A which was a short circuit current of the example 1 module for 1.5 SUN, the diode had a temperature of about 70° C., which is lower than a temperature at which a resin for sealing the module starts to change in its quality, i.e., 100° C., and less than a maximal temperature, i.e., 80° C. at which the module is actually exposed outdoors.

As described above, the present invention can provide an integrated thin-film photoelectric conversion module capable of achieving high output and high reliability and can particularly provide a highly reliable integrated hybrid thin-film photoelectric conversion module fabricable rather simply and inexpensively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated thin-film photoelectric conversion module comprising a multi-layered film including a first electrode layer, a semiconductor layer and a second electrode layer stacked on a main surface of a substrate, said multi-layered film including a cell region containing a plurality of photoelectric conversion cells connected in a series, a bypass diode region including a bypass diode and a connection region, said connection region failing to connect said bypass diode to any one of said cells when a said cell is subjected to reverse bias treatment, said connection region connecting said bypass diode in antiparallel to one or more of said cells connected in series after said one or more cells are subjected to the reverse bias treatment,
   wherein said connection region has said first electrode layer and said second electrode layer short-circuited to enable a reverse bias treatment of said bypass diode.

2. The module of claim 1, wherein before the reverse bias treatment of said one or more cells, said connection region has said first electrode layer and said second electrode layer short-circuited by a conductive material applied in a gap extending from said second electrode layer to said first electrode layer.

3. The module of claim 1 wherein in said reverse bias treatment, connection of said connection region to said one or more cells is cut by a gap penetrating said multi-layered film.

4. The module of claim 3, wherein a selected one of said cells connected in series has said second electrode layer continuous to the second electrode layer of said connection region and then connected to the first electrode layer of said connection region by a conductive material applied after said reverse bias treatment to fill said gap penetrating said multi-layered film, said connection region has said first electrode layer continuous to said first electrode layer of said bypass diode, and said bypass diode has said second electrode layer continuous to said second electrode layer of a cell different from said selected cell.

5. The module of claim 1, wherein in said cell region, each of said cells has an elongated rectangular geometry including a major axis and a minor axis and said cells are connected in series in a direction of the minor axis, and gaps are provided between said cell region, said bypass diode region and said connection region for adjusting electric connections, each said gap being formed in a linear line segment parallel to a direction of the minor axis of each rectangular cell.

6. The module of claim 5, wherein one or two of said bypass diodes are provided adjacent to one end or both ends of said major axis of a said cell.

7. The module of claim 5, wherein said cell region includes more than one array of said cells connected in series, the arrays being connected in parallel, between two adjacent said arrays there being arranged a bypass diode connected in antiparallel through said connection region to both the same number of the cells in said two adjacent arrays.

8. The module of claim 6, wherein said semiconductor layer includes an amorphous photoelectric conversion layer and a crystalline photoelectric conversion layer arranged in tandem.

9. A method of fabricating the integrated thin-film photoelectric conversion module as recited in claim 4, comprising the steps of:

applying reverse bias voltage between said electrode layer of one of said cells and that of another cell adjacent to said one cell or between said second electrode layer of said bypass diode and that of said connection region adjacent to said bypass diode to eliminate short circuit defects in at least one of said cells and said bypass diode; and then applying conductive material in the gap penetrating said multi-layered film.

10. The module of claim 5, wherein said major axis is less than 25 cm in length.

11. The module of claim 1, wherein said first electrode layer has a textured surface including fine unevenness.

12. The module of claim 11, wherein a gap is provided for connecting the first electrode of said cell to the second electrode of an adjacent cell, and wherein said gap is filled with the same material as that of the second electrode.

13. The module of claim 2, wherein said gap is filled with the same conductive material as that of said second electrode.

14. The module of claim 1, wherein one by pass diode is connected in reverse to each cell of said plurality of photoelectric conversion cells.

15. The module of claim 5, wherein said first electrode layer is divided by a gap, said gap being comprised of a plurality of narrow laser scribed gaps.

16. The module of claim wherein 15, said narrow laser-scribed gaps have a width of less than 0.5 mm.

17. The module of claim 1, wherein the area of said bypass diode is small compared to the area of said cell.

18. The module of claim 17, wherein the area of said bypass diode is between 0.1 to 0.3 $cm^2$.

* * * * *